(12) United States Patent
Nakamura

(10) Patent No.: US 6,368,959 B1
(45) Date of Patent: Apr. 9, 2002

(54) METHOD OF MANUFACTURING SEMICONDUCTOR DEVICE

(75) Inventor: Makiko Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/358,367

(22) Filed: Jul. 21, 1999

(30) Foreign Application Priority Data

Apr. 9, 1999 (JP) ............................................. 11-102603

(51) Int. Cl.⁷ ..................... H01L 21/4763; H01L 21/44; H01L 21/311
(52) U.S. Cl. ....................... 438/640; 438/656; 438/673; 438/685; 438/701
(58) Field of Search ................................ 438/629, 622, 438/626, 628, 637–656, 672–673, 683, 685, 700, 701, 734

(56) References Cited

U.S. PATENT DOCUMENTS

| | | | |
|---|---|---|---|
| 5,486,492 A | * | 1/1996 | Yamamoto et al. ......... 437/192 |
| 5,514,622 A | * | 5/1996 | Bornstein et al. ........... 437/189 |
| 5,726,098 A | * | 3/1998 | Tsuboi ........................ 438/622 |
| 5,849,618 A | * | 12/1998 | Jeon ............................ 438/254 |
| 5,872,053 A | * | 2/1999 | Smith ........................ 438/626 |

FOREIGN PATENT DOCUMENTS

| | | |
|---|---|---|
| JP | 07201993 | 8/1995 |
| JP | 08222632 A | 8/1996 |
| JP | 10-163207 | 6/1998 |
| JP | 10214834 | 8/1998 |
| JP | 11031745 A | 2/1999 |

* cited by examiner

Primary Examiner—Matthew Smith
Assistant Examiner—Calvin Lee
(74) Attorney, Agent, or Firm—Volentine Francos, PLLC

(57) ABSTRACT

A first insulating film, a first wiring layer and a second insulating film are successively formed over a semiconductor substrate. A resist mask is patterned over the second insulating film, and isotropic etching and anisotropic etching are successively carried out to define a plurality of via holes within the second insulating film. The via holes thus have a first portion formed by the isotropic etching and a second portion formed by the anisotropic etching. The resist mask is removed, and a high melting-point metal film is formed over the second insulating film so as to be embedded in the plurality of via holes. The high melting-point metal film and the second insulating film are then polished down to the first portion of each of the via holes such that respective portions of the high melting-point metal film formed within adjacent ones of the plurality of via holes are isolated from each other. A second wiring layer is then formed so as to be electrically connected to the first wiring layer through the portions of the high melting-point metal film formed within the plurality of via holes.

8 Claims, 2 Drawing Sheets

METHOD OF MANUFACTURING SEMICONDUCTOR DEVICE

BACKGROUND OF THE INVENTION

1. Field of the Invention

This invention relates to a method of manufacturing a semiconductor device. Specifically, the present invention relates to a method of manufacturing a semiconductor device having a multilayer interconnection structure, wherein via hole contacts are formed.

2. Description of the Related Art

As to a multilayer interconnection used in a semiconductor device, a multilayer metal film comprised of a structure wherein an aluminum alloy film is sandwiched between high melting-point metal films such as a titanium (Ti) film, a titanium nitride (TiN) film, etc. or a structure sandwiched with a stacked or laminated film thereof has heretofore been used as interconnections for respective layers. When wiring layers for the respective layers are electrically connected to one another, they are electrically connected to one another by using plugs formed in via holes defined in an interlayer insulating film, e.g., tungsten (W) plugs as a typical example. The W plugs are formed in the following manner. A TiN film used as an adhesive layer is formed within the via holes defined in the interlayer insulating film by sputtering. Thereafter, a W film is formed so as to be fully embedded in the via holes by chemical vapor deposition (CVD) for reducing a tungsten hexafluoride ($WF_6$) gas by a silane ($SiH_4$) gas or hydrogen ($H_2$) gas.

With respect to the formation of the W film, a nucleated layer of W is first formed with a thickness range of about 5 nm to 50 nm under the condition that the $SiH_4$ gas is heavily supplied. The resultant nucleated layer serves as a bed or primary film for growing the W film to a uniform film thickness. The formation of the W film under such a condition is rate-controlled according to the supply of the $WF_6$ gas. As a result, there is a tendency to form the W film so as to be thicker than other portions at ends of the via holes. Next, the W film for embedding the via holes therein is formed under the condition that the $H_2$ gas is heavily supplied. The formation of the W film under such a condition is rate-controlled by a reduction reaction of the $WF_6$ gas. As a result, the W film can be uniformly formed at any portion in the via holes. After the completion of the embedding of the via holes, the W film provided at locations other than the via holes is removed by etchback or CMP (Chemical Mechanical Polishing), so that W plugs are formed within the via holes respectively.

However, the conventional method of manufacturing the semiconductor device has encountered difficulties in ensuring a satisfactory device characteristic because it has the following problems. When the via hole is reduced in diameter with miniaturization of a device, the TiN film used as the adhesive layer is not sufficiently formed within each via hole. This results from the fact that the TiN film would be formed so as to become thicker than other portions at the via-hole ends. Since the TiN film is formed thick at the ends of the via holes, the via holes are reduced in diameter at their ends. Even if the uniform W film could be formed, voids remain within the via holes respectively.

Upon etchback, the etching rapidly progresses inside the via holes in which the voids exist thereinside, so that even a lower layer interconnection is overetched. Further, an oxidizing agent used upon CMP of the W film enters into the voids to thereby dissolve the W film. Furthermore, the etching of the voids in the via holes might progress in parallel with the etching of an upper layer interconnection in the case of a macro device in which sufficient alignment allowance cannot be set to the interconnection and via holes, so that a satisfactory device characteristic cannot be ensured.

SUMMARY OF THE INVENTION

An object of the present invention is to provide a method of manufacturing a semiconductor device capable of ensuring a satisfactory device characteristic.

According to one aspect of the invention, there is provided a method of manufacturing a semiconductor device, comprising:

successively forming a first insulating film, a first wiring layer and a second insulating film comprised of a laminated film of a single layer or two or more layers over a semiconductor substrate;

preparing a resist mask patterned over the second insulating film and successively effecting isotropic etching and anisotropic etching thereon to thereby define a plurality of via holes;

forming a high melting-point metal film so as to be sufficiently embedded in the plurality of via holes;

polishing the high melting-point metal film and the second insulating film until the high melting-point metal films formed within the plurality of via holes adjacent to each other are isolated from each other; and forming a second wiring layer electrically connected to the first wiring layer through the high melting-point metal films formed within the plurality of via holes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

[First embodiment]

Figure 1A:
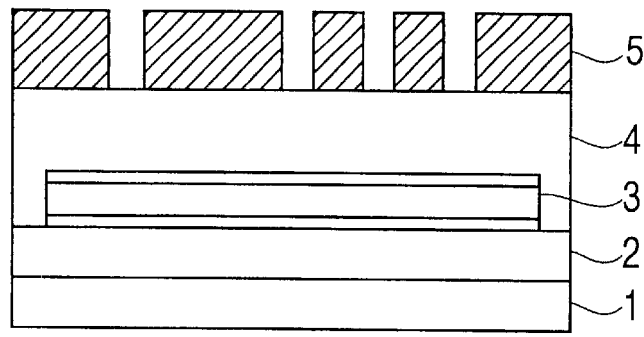
FIGS. 1a–1d are process diagrams showing a first embodiment of the present invention.
Figure 1B:
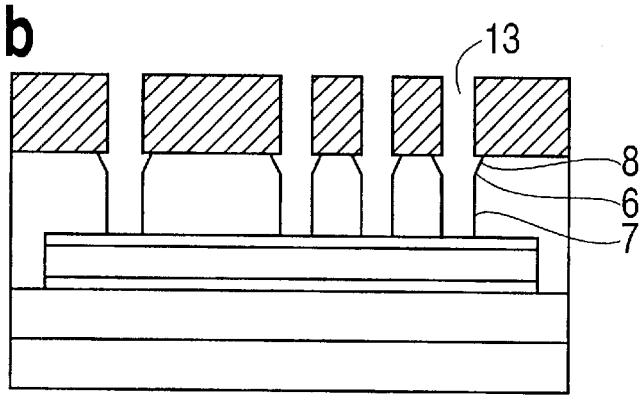
Figure 1C:
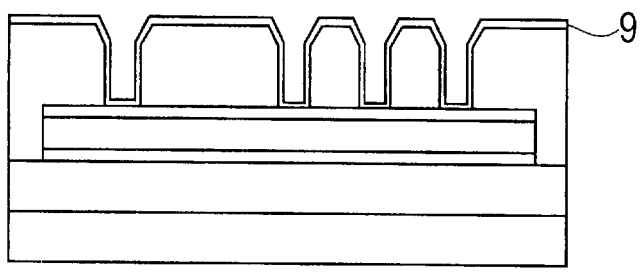
Figure 1D:
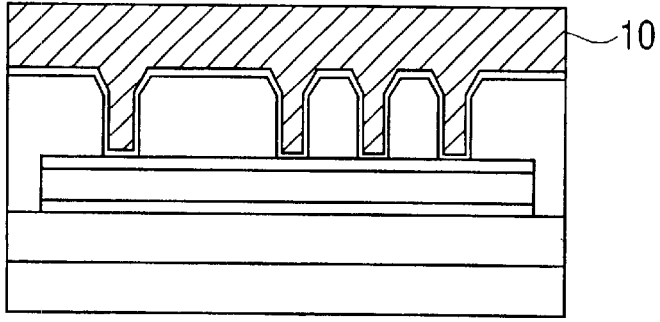
Figure 2A:
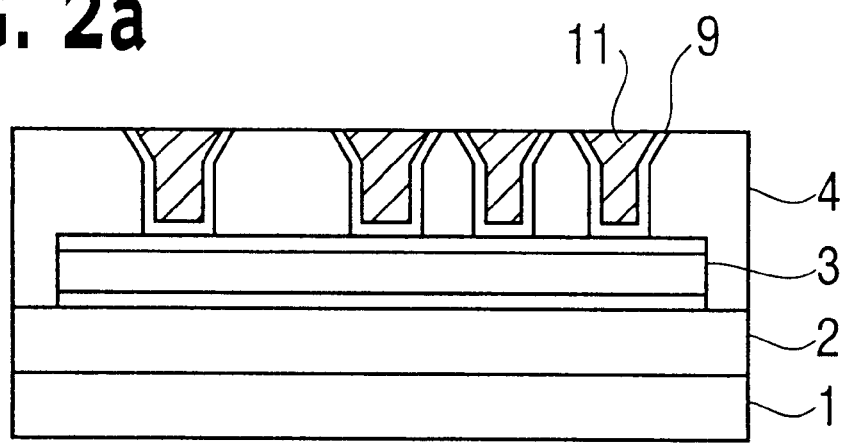
FIGS. 2a–2b are process diagrams illustrating the first embodiment of the present invention.
Figure 2B:
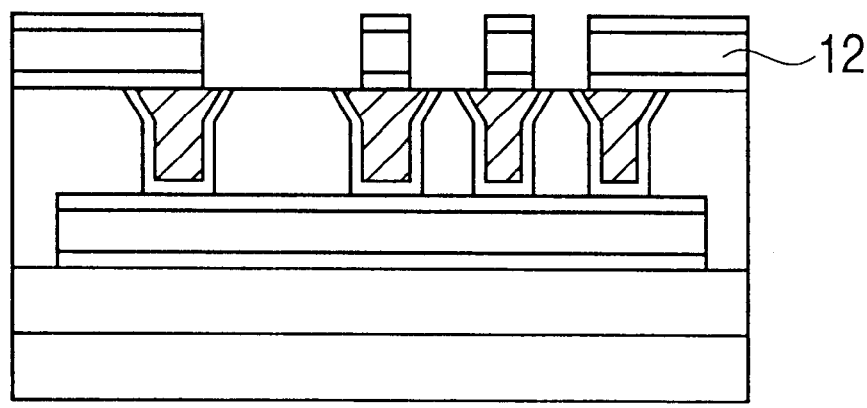

FIGS. 1 and 2 are process diagrams showing a first embodiment of the present invention. A silicon oxide film 2, a first wiring layer 3 corresponding to a lower interconnection, and a silicon oxide film 4 corresponding to an interlayer insulating film lying between an upper interconnection and the lower interconnection are successively formed over a semiconductor substrate 1 having unillustrated transistors, etc. Thereafter, a resist mask 5 in which via hole patterns each having a desired diameter are patterned, is prepared on the silicon oxide film 4 (see FIG. 1a). The first wiring layer 3 is comprised of a structure wherein an aluminum alloy film is sandwiched between high melting-point metal films such as Ti or TiN, or a structure sandwiched with a stacked or laminated layer of the high melting-point films. The silicon oxide films 2 and 4 are formed by a DVD method or an application method and are comprised of a single layer or laminated structure. Prior to the preparation of the resist mask 5 on the silicon oxide film 4, the surface of the silicon oxide film 4 is subjected to a flattening process by CMP or the like.

Next, the silicon oxide film 4 is subjected to isotropic etching by using the patterned resist mask 5, followed by subjecting the same to anisotropic etching such as reactive ion etching (RIE) or the like, so that via holes 13 are defined or opened (see FIG. 1b). As shown in FIG. 1b, each via hole 13 has a wine-glass configuration having a portion 6 formed by isotropic etching and a portion 7 formed by anisotropic etching. The diameter of an end 8 of each via hole 13 is larger than the diameters of other portions.

After the removal of the resist mask 5, each opened via hole 13 is cleaned by sputter etching and a TiN film 9 used as an adhesive layer is formed (see FIG. 1c). Next, a W film 10 equivalent to such a quantity as to sufficiently fill in the via holes 13 is formed by a CVD method using a $WF_6$ gas (see FIG. 1d).

Next, the W film 10 other than that for the via holes 13, in other words, the W film 10 extending up to the ends 8 of the via holes 13 is polished and removed by CMP. While the example using CMP has been described here, anisotropic etching may be used. Further, the silicon oxide film 4, the TiN film 9 and the W film 10 lying within each via hole 13 are polished and removed together by using CMP, whereby W plugs 11 are formed (see FIG. 2a). The polishing/removal at this time is performed so that the W plugs 11 on the semiconductor chip, which are adjacent to one another at the narrowest pitch, are sufficiently isolated from one another. Further, the surfaces of the W plugs 11 are also flattened. Incidentally, the W plugs 11 can be also formed in a once-CMP process by controlling CMP.

Finally, a second wiring layer 12 corresponding to an upper interconnection, which comprises a structure wherein an aluminum alloy film is sandwiched between high melting-point metal films such as Ti or TiN, or a structure sandwiched with a stacked or laminated layer of the high melting-point films, is formed in a manner similar to the first wiring layer 3. The second wiring layer 12 is formed by photolithography/etching after the deposition of a laminated metal film by sputtering.

While the method of manufacturing the semiconductor device having the multilayer interconnection structure of two layers has been described in the present embodiment, a semiconductor device having a multilayer interconnection structure with three or more wiring layers can be also manufactured by repeating process steps similar to those employed in the present embodiment.

According to the present embodiment, the isotropic etching and the anisotropic etching are successively effected upon formation of the via holes so that the TiN film used as the adhesive layer can be prevented from thickly adhering to the end of each via hole. Thus, since the $WF_6$ gas can sufficiently be charged into the via holes in the next process step, the W film can be satisfactorily embedded into the via holes.

According to the present embodiment as well, since the high melting-point metal film used as the adhesive layer formed within each via hole is diagonally formed, the high melting-point metal film used as the adhesive layer formed within the via holes is not etched upon anisotropic etching in the subsequent upper interconnection forming process step. As a result, a satisfactory device structure free of voids around the W plugs can be obtained.

According to the present invention, as has been described above in detail, a semiconductor device having macro interconnections of satisfactory shapes can be manufactured. In other words, it is possible to provide a semiconductor device which has ensured a satisfactory device characteristic.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming an insulating layer over a semiconductor substrate;

forming a plurality of contact holes in an upper surface of the insulating layer by subjecting the insulating layer to an isotropic etching and an anisotropic etching, wherein each of the contact holes has an upper portion formed by the isotropic etching and a lower portion formed by the anisotropic etching, and wherein an interior surface of the upper portion of each of the contact holes extends obliquely relative to the upper surface of the insulating layer;

forming an adhesive layer on the upper surface of the insulating layer, on the interior surface of the upper portion of each contact hole, and on an interior surface of the lower portion of each contact hole;

depositing a refractory metal layer on the adhesive layer such that the refractory metal layer extends within each of the contact holes and over the upper surface of the insulating layer;

polishing away the refractory metal layer, the adhesive layer and the insulating layer down to a level of the insulating layer at which a first part of the upper portion of each contact hole is removed and a second part of the upper portion of each contact hole remains, wherein respective portions of the refractory metal layer within the contact holes are isolated from one another after said polishing, wherein respective portions of the adhesive layer remain on the second part of the upper portion of each of the contact holes, and wherein said polishing is chemical mechanical polishing; and forming a conductive layer on the respective portions of the refractory metal layer formed within the plurality of the contact holes.

2. The method of claim 1, further comprising forming a wiring layer over the semiconductor substrate prior to forming the insulating layer, wherein said plurality of contact holes are formed so as to expose an upper surface of said wiring layer.

3. The method of claim 2, wherein the adhesive layer is a titanium nitride layer.

4. The method of claim 3, wherein the refractory metal layer is a tungsten layer.

5. The method of claim 1, wherein the adhesive layer is a titanium nitride layer.

6. The method of claim 1, wherein the refractory metal layer is a tungsten layer.

7. A method of manufacturing a semiconductor device comprising:

forming an insulating layer over a semiconductor substrate;

forming a contact hole in an upper surface of the insulating layer by subjecting the insulating layer to an isotropic etching and an anisotropic etching, wherein the contact hole has an upper portion formed by the isotropic etching and a lower portion formed by the anisotropic etching;

forming a titanium nitride layer on the upper surface of the insulating layer, on an interior surface of the upper portion of the contact hole, and on an interior surface of the lower portion of the contact hole;

depositing a tungsten layer on the titanium nitride layer such that the tungsten layer extends within the contact hole and over the upper surface of the insulating layer;

polishing away the tungsten layer, the titanium layer and the insulating layer down to a level of the insulating layer at which a first part of the upper portion of the contact hole is removed and a second part of the upper portion of the contact hole remains, wherein a portion of the refractory metal layer within the contact hole remains after said polishing, wherein a portion of the adhesive layer remains on the second part of the upper portion of the contact hole, and wherein said polishing is chemical mechanical polishing;

forming a conductive layer on the portion of tungsten layer formed within the contact hole.

8. The method of claim 7, further comprising forming a wiring layer over the semiconductor substrate prior to forming the insulating layer, wherein said plurality of contact holes are formed so as to expose an upper surface of said wiring layer.

* * * * *